(12) United States Patent
Jang et al.

(10) Patent No.: US 6,417,055 B2
(45) Date of Patent: Jul. 9, 2002

(54) METHOD FOR FORMING GATE ELECTRODE FOR A SEMICONDUCTOR DEVICE

(75) Inventors: Se Aug Jang; Tae Kyun Kim, both of Kyoungki-do; In Seok Yeo, Seoul, all of (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 09/895,295

(22) Filed: Jul. 2, 2001

(30) Foreign Application Priority Data

Jun. 30, 2000 (KR) ........................................ 2000-37413

(51) Int. Cl.[7] .............................................. H01L 21/336
(52) U.S. Cl. ...................... 438/303; 438/306; 438/279; 438/586; 438/595
(58) Field of Search ................................ 438/275, 279, 438/299, 303, 306, 583, 586, 595

(56) References Cited

U.S. PATENT DOCUMENTS 6,307,226 B1 * 10/2001 Dennison .................... 257/296

* cited by examiner

Primary Examiner—Tuan H. Nguyen
Assistant Examiner—Jack Chen
(74) Attorney, Agent, or Firm—Pillsbury Winthrop LLP

(57) ABSTRACT

The present invention relates to a method for forming a gate electrode in a semiconductor device that is more tolerant of misalignment during contact formation processing. The improved gate structure reduces the formation of shorts between the gate electrode and subsequently formed conductors such as DRAM bit lines and storage lines. The gate electrode is formed from a damascene metal gate electrode having adjacent insulating spacers by partially etching the metal gate electrode to form a trench; depositing a nitride film; and etching the nitride film to form additional protective insulators above outer portions of the gate electrodes. With these protective insulators in place, subsequent contact processing becomes more tolerant of misalignment, reducing rework and improving yield.

11 Claims, 6 Drawing Sheets

METHOD FOR FORMING GATE ELECTRODE FOR A SEMICONDUCTOR DEVICE

BACKGROUND OF THE INVENTION

1. Field of the Invention

The invention relates to a method for forming a gate electrode in a semiconductor device and, more particularly, a method for forming a gate electrode in a semiconductor device that includes a self-aligned contact (SAC) process for forming a damascene tungsten (W) gate.

2. Description of the Related Art

In general, a gate electrode is an electrode utilized to control a single MOS transistor and is most commonly formed from a doped polysilicon layer. Utilizing a polysilicon gate electrode is advantageous in that the process for forming such gates is well known and stable. However, it is known that polysilicon gates have certain drawbacks such as a high resistivity and/or a depletion phenomenon. For these reasons, polysilicon is unsuitable as the gate material in highly integrated semiconductor devices.

In the past, in order to make up for the drawbacks of the doped polysilicon gate, a metal film having a high electric conductivity and good thermal stability was used as a material for gate electrodes. The preferred metal films exhibited a work function located in a mid-band gap of silicon and could, therefore, provide a threshold voltage that is symmetric between NMOS and PMOS regions. Such metal films have included tungsten (W), tungsten nitride (WN), titanium (Ti), molybdenum (Mo), tantalum (Ta), aluminum (Al) and copper (Cu).

However, the metal films has a difficulty to be patterned into a gate electrode form. Also, during the ion implantation process necessary to form the source and drain regions, the surface of the metal film may be damaged. Moreover, during the thermal processing necessary to activate the implanted impurity ions to form the source and drain regions, a thermal load is exerted on the gate electrode, causing variations in the characteristics of the resulting semiconductor devices.

In order to solve the above-mentioned problems, a method has been proposed for forming a gate electrode using a metal film in accordance with a damascene technique. This technique will be described with reference to FIGS. 1A to 1E.

As shown in FIG. 1A, a buffer gate insulating film 2, polysilicon layer 3a, and a hard mask layer 3b are sequentially formed on a semiconductor substrate 1 where a field-oxidized film (not shown) has been formed to a desired height to define active and isolation regions. The hard mask layer 3b is then patterned and etched in the form of a gate electrode. The polysilicon layer 3a and the buffer gate insulating film 2 are then etched using the hard mask 3b as an etch mask to have to form dummy gate g. Spacers 4 are then formed at both sides of each dummy gate g utilizing a conventional method. Impurity ions are then implanted into the exposed portion of semiconductor substrate 1 outside of the spacers 4 to form source and drain regions 5.

As shown in FIG. 1B, an interlayer insulating film 6 is then deposited over the resulting structure of the semiconductor substrate 1 and dummy gate electrodes g. The interlayer insulating film 6 is then subjected to a chemical mechanical polishing (CMP) process to remove a portion of the insulating interlayer insulating film and expose the top surfaces of the dummy gates g.

As shown in FIG. 1C, the dummy gates g, that is, the hard mask layer 3b, the polysilicon layer 3a, and the buffer gate insulating film 2, are then selectively etched. Consequently, only the interlayer insulating film 6 and the spacers 4 remain on the semiconductor substrate 1.

As shown in FIG. 1D, a gate insulating film 7 and a metal film 8 are sequentially formed on the exposed surface portions of the semiconductor substrate 1, the inner sidewall surfaces of the spacers 4 and the top surface of the interlayer insulating film 6.

Finally, as shown in FIG. 1E, the metal film 8 and the gate insulating film 7 are chemically and mechanically polished to expose the top surfaces of the interlayer insulating films 6, thereby forming damascene metal gate electrodes 8a in respective regions where the dummy gates had been formed.

The damascene metal gate electrodes 8a thus obtained provide certain advantages by deferring the gate electrode formation until after the transistor source/drain regions have been formed. For example, it is possible to avoid both the difficulties associated with patterning metal layers, plasma damage that can occur during the etch process, and damage from the ion implantation processes, and thermal damage that can occur during the subsequent thermal process used to activate the source/drain regions.

FIG. 2 is a cross-sectional view illustrating problems involved in conventional gate electrodes.

Conventionally, the manufacture of a memory device involves a process for forming contact openings for bringing the sources/drains into contact with the desired bit lines and storage lines after a formation of transistors.

In the manufacture of highly integrated memory devices, misalignment problems inevitably occur in association with the contact patterning process. FIG. 2 shows a method conventionally used to compensate for such misalignment problems. In accordance with the method shown in FIG. 2, a gate electrode patterning process is only after a hard mask layer 3b has been deposited over a gate electrode g and nitride film spacers 4 have been formed on the sidewalls of the gate electrode g to surround the gate electrode g. As a result, as shown in FIG. 2, even if contacts 9 are misaligned during the exposing process, the spacers 4 and the hard mask layer 3b serve as etch barriers and insulators, whereby the formation of being short-circuits between the gate electrode and a bit line or storage line can be suppressed.

In the case of the gate structure formed by using the damascene process as shown in FIGS. 1A to 1E, however, it is impossible to prevent the metal gate electrode 8a from being prone to short-circuits with a bit line or storage line in the event of contact misalignment because there is no nitride film metal gate electrode 8a that can serve as an etch barrier.

SUMMARY OF THE INVENTION

Therefore, the present invention has been made in order to solve the above-mentioned problems in the prior art. An object of the present invention is to provide a method for forming a gate electrode in a semiconductor device in which a nitride film is formed over damascene metal gate electrodes, thereby protecting the gate electrodes from being short-circuited to a bit line or storage line even if the contact pattern is misaligned.

In order to achieve the above object, the method for forming a gate electrode in a semiconductor device according to the present invention is characterized by the steps of:

forming a damascene metal gate electrode provided with spacers at respective sidewalls thereof;

recess-etching the damascene metal gate electrode to form a trench;

depositing a nitride film over a structure obtained after the formation of the trench;

blanket-etching the nitride film with a dry etch without using a mask;

depositing an interlayer insulating film over a structure obtained from the blanket-etching step; and subjecting a structure obtained after the deposition of the interlayer insulating film to a patterning and etch process to partially expose respective surfaces of source and drain regions formed in the structure, thereby forming contact openings.

The damascene metal gate electrodes are preferably made from a material selected from a group consisting of tungsten (W), tungsten nitride (WN), titanium (Ti), titanium nitride (TiN), molybdenum (Mo), tantalum (Ta), and tantalum nitride (TaN) with a preferred thickness of 2,000–2,500 Å.

The spacers are made from a nitride film with a deposited thickness of between 100 to 1,500 Å.

The trench has a preferred depth of 500 to 1,000 Å.

BRIEF DESCRIPTION OF THE DRAWINGS

The above objects, and other features and advantages of the present invention will become more apparent after a reading of the following detailed description when taken in conjunction with the referenced drawings.

DESCRIPTION OF THE PREFERRED EMBODIMENTS

Now, a preferred embodiment according to the present invention will be described in detail, with reference to the incorporated drawings.

Figure 1A:
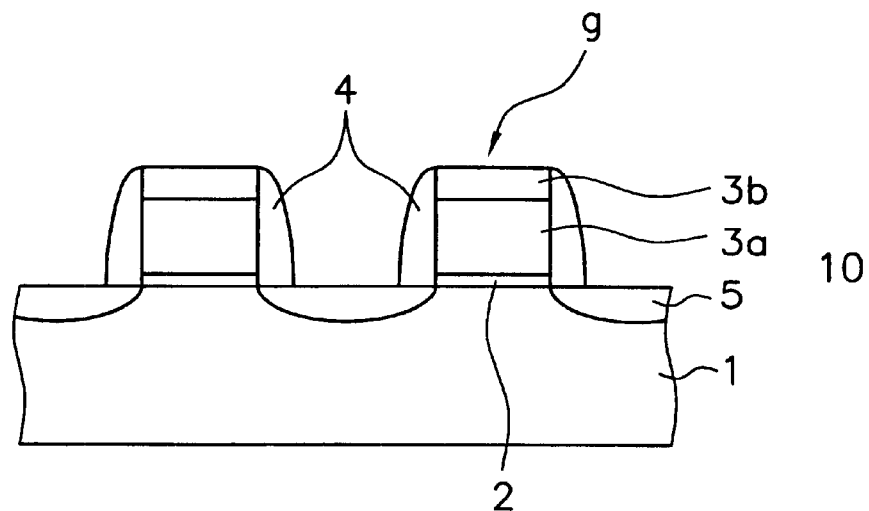
FIGS. 1A to 1E are cross-sectional views illustrating a prior art method for forming a gate electrode.
Figure 1B:
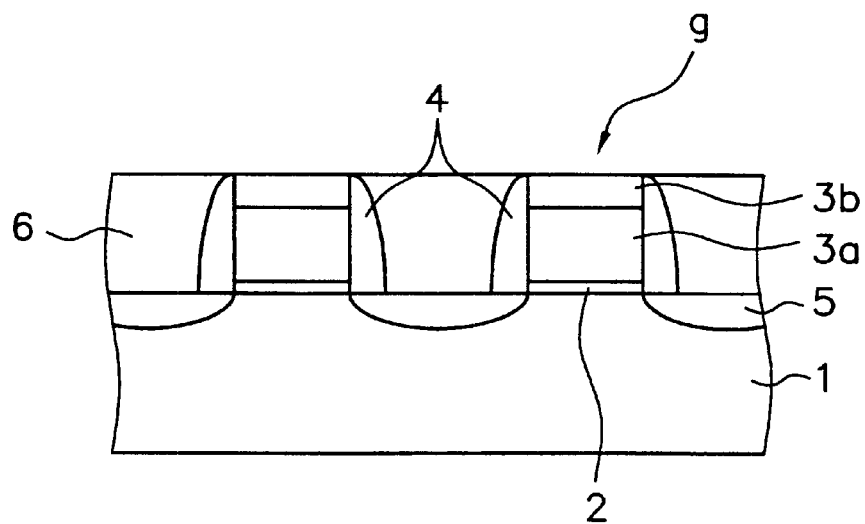
Figure 1C:
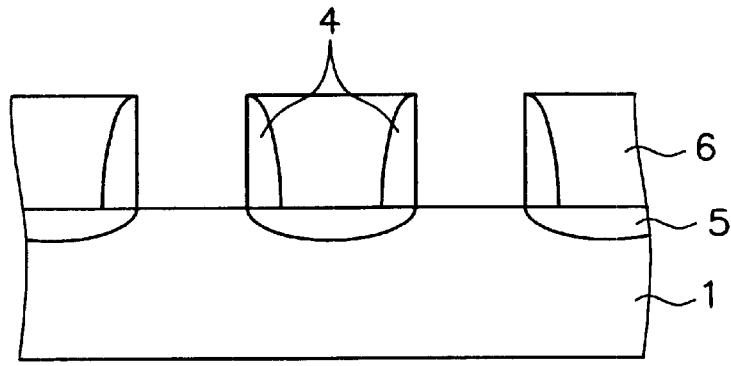
Figure 1D:
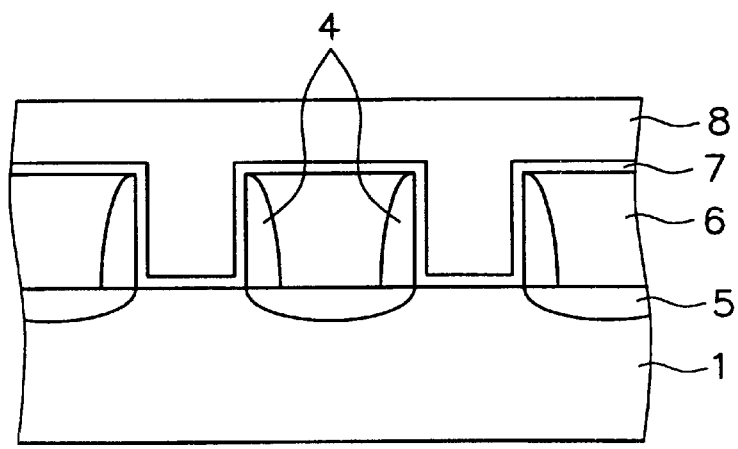
Figure 1E:
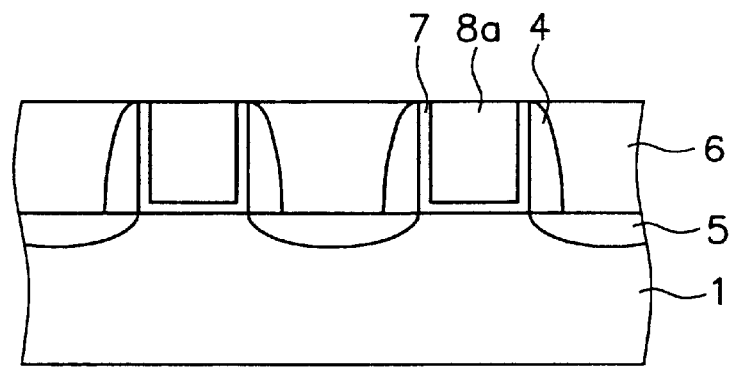
Figure 2:
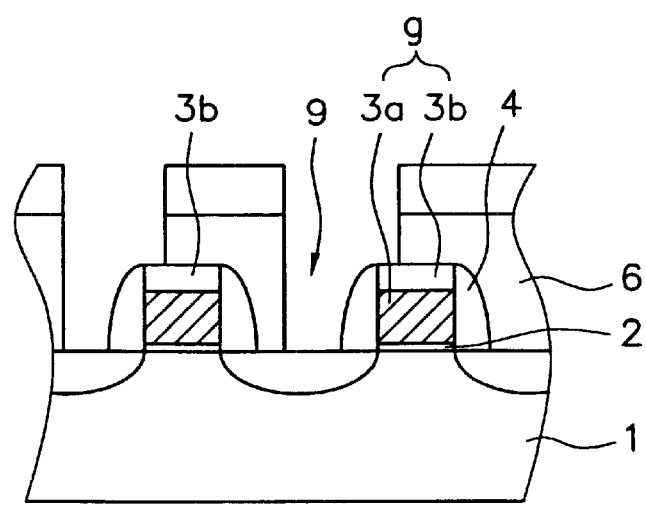
FIG. 2 is a cross-sectional view illustrating misalignment problems of the gate electrodes in a prior art method.
Figure 3A:
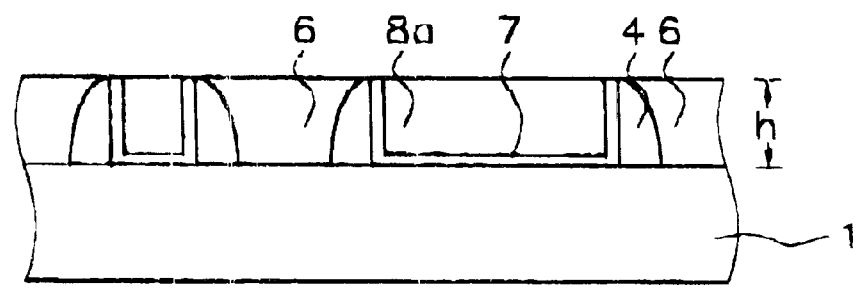
FIGS. 3A to 3F are cross-sectional views respectively illustrating sequential processing steps of a method according to the present invention for forming a gate electrode in a semiconductor device.

FIG. 3A shows a wafer 1 after damascene metal gate electrodes 8a provided with spacers 4 at the gate sidewalls have been formed (FIG. 1E). The damascene metal gate electrodes 8a may be made of tungsten (W), tungsten nitride (WN), titanium (Ti), titanium nitride (TiN), molybdenum (Mo), tantalum (Ta), or tantalum nitride (TaN). For forming the spacers 4, a nitride film is generally preferred.

In order to implement the present invention, the damascene metal gate electrodes 8a preferably have a metal thickness of 2,000 to 2,500 Å.

Figure 3B:
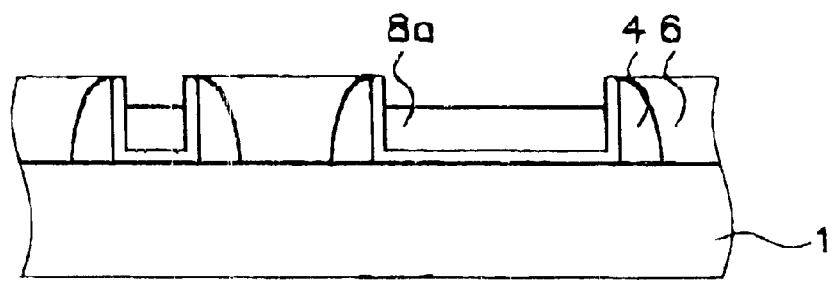

The damascene metal gate electrodes 8a are then recess-etched to a depth of 500 to 1,000 Å using an appropriate dry or wet etch method to form trenches (FIG. 3B).

Figure 3C:
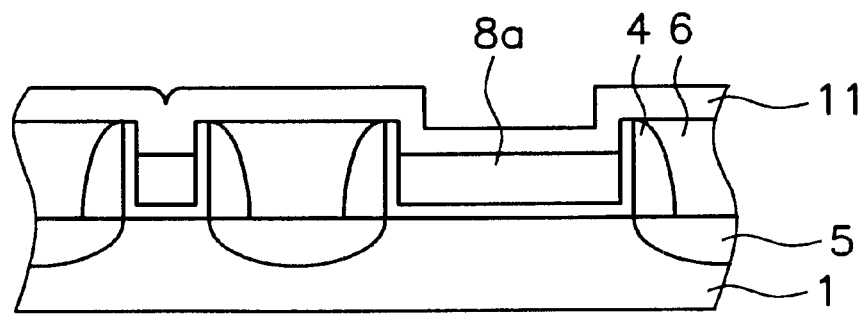

A nitride film 11 is then deposited on the resultant structure (FIG. 3C). The nitride film 11 is deposited to a thickness of 100 to 1,500 Å.

Figure 3D:
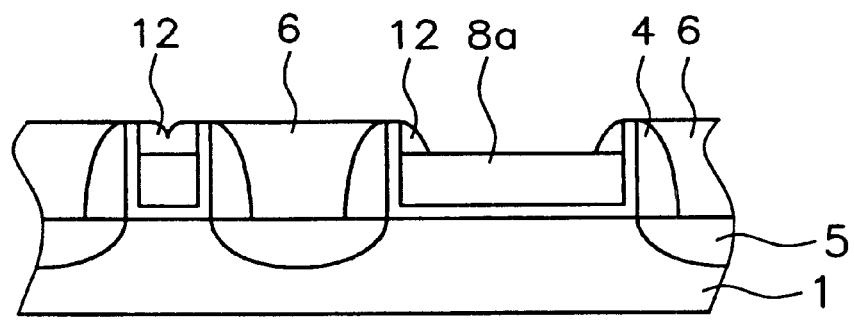

The nitride film is subsequently blanket-etched in a dry way without using any mask (FIG. 3D).

When the gate design rule is small (for example, a gate width of 0.10 μm) and the thickness of the nitride film 11 is great (for example, a deposition thickness of more than 1,000 Å), the trenches are completely filled by the nitride film 11. Meanwhile, in wide gate regions, the structure shown in FIG. 3D resulting from the process has spacers 12 on the inner sidewalls of the gates. However, this does not interfere with the realization of the present invention.

Figure 3E:
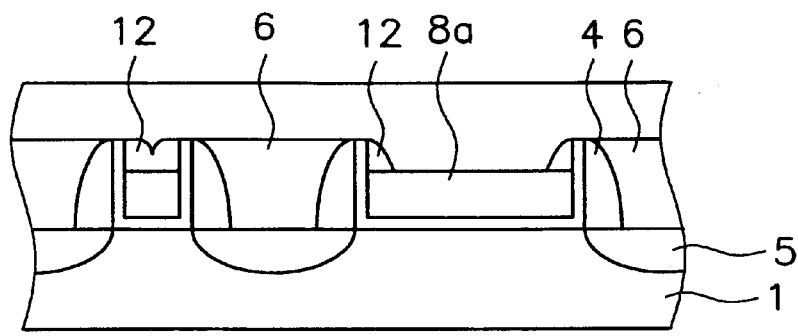

An interlayer insulating film 13 is then deposited over the structure shown in FIG. 3D resulting from the described process to form the structure shown in FIG. 3E.

Figure 3F:
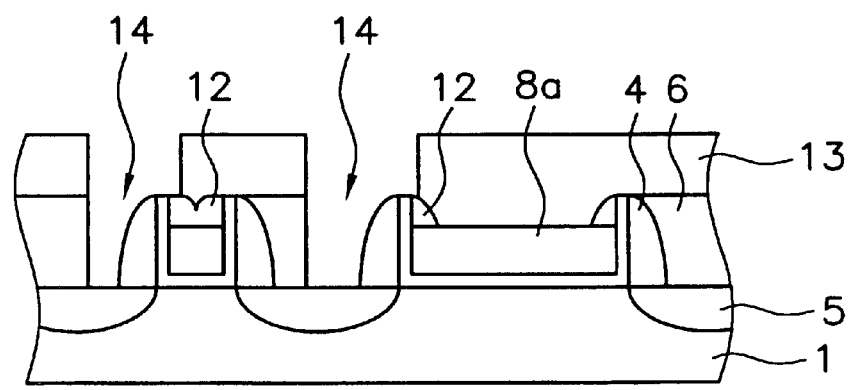

Source and drain regions 5 are then exposed by conducting conventional patterning and etch process to form contacts 14 (FIG. 3F).

The maximum degree of contact hole misalignment acceptable for a patterning process is typically not more than 30% of the design rule. For example, devices having a gate width of 0.10 μm would typically have a maximum misalignment degree of 0.03 μm (300 Å). Accordingly, for a device having a 0.10 μm gate electrode design rule, the nitride is preferably film 11 deposited to a thickness of at least 300 Å. By ensuring that the nitride layer is at least as thick as the maximum misalignment even if inner spacers 12 are formed at inner sidewalls of gates they will be of sufficient width to serve as etch barriers during the self-aligned contact etching process and thus prevent shorts to the gate electrodes.

As described above, according to the present invention of the method forming a gate electrode with a nitride film over the damascene metal gate electrodes 8a, short-circuits between the gate electrodes and the bit lines or storage lines can be prevented when the contacts are misaligned. Therefore, the method of the present invention makes it possible to apply a self-aligned contact process to damascene gates without high levels of shorts or excessively stringent alignment requirements. Thus, it is possible to fabricate a transistor of a memory device having repeatable good quality and yield.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed:

1. A method for forming a gate electrode in a semiconductor device comprising steps of:

forming a damascene metal gate electrode provided with spacers at respective sidewalls thereof;

recess-etching the damascene metal gate electrode to form a trench;

depositing a nitride film over a structure obtained after the formation of the trench;

blanket-etching the nitride film in a dry way without using a mask;

depositing an interlayer insulating film over a structure obtained from the blanket-etching step; and subjecting a structure obtained after the deposition of the interlayer insulating film to an exposing process and an etching process to partially expose respective surfaces of sources and drains formed in the structure, thereby forming contacts.

2. The method for forming a gate electrode in a semiconductor device according to claim 1, wherein the damascene metal gate electrode comprise a material selected from a group consisting of tungsten (W), tungsten nitride (WN), titanium (Ti), titanium nitride (TiN), molybdenum (Mo), tantalum (Ta), and tantalum nitride (TaN).

3. The method for forming a gate electrode in a semiconductor device according to claim 1, wherein the spacers comprise a nitride.

4. The method for forming a gate electrode in a semiconductor device according to claim 1, wherein the damascene metal gate electrode have a height of 2,000 to 2,500 Å.

5. The method for forming a gate electrode in a semiconductor device according to claim 1, wherein the trench has a depth of 500 to 1,000 Å.

6. The method for forming a gate electrode in a semiconductor device according to claim 1, wherein the nitride film has a thickness of 100 to 1,500 Å.

7. A method for forming a gate electrode in a semiconductor device comprising steps performed in the following sequence:

forming a plurality of damascene metal gate electrodes on a semiconductor substrate, the damascene metal gate electrodes having substantially vertical sidewalls with nitride spacers formed adjacent the sidewalls, the damascene metal gate electrodes being further separated by an insulating material between the nitride spacers;

etching a portion of the damascene metal gate electrode to form a trench, the trench having substantially vertical trench walls;

depositing a nitride film; and etching the nitride film using an anisotropic etch, the duration of the etch being sufficient to remove the majority of the nitride film while leaving intact a portion of the nitride film adjacent the trench walls.

8. A method for forming a gate electrode in a semiconductor device according to claim 7 further comprising the steps of:

depositing an interlayer insulating film;

forming a photoresist pattern on the interlayer insulating film;

etching exposed portions of the interlayer insulating film and the insulating material to form exposed regions on the semiconductor substrate.

9. A method for forming a gate electrode in a semiconductor device according to claim 8 further comprising the steps of:

depositing a conductive layer, the conductive layer being deposited on the semiconductor substrate in the exposed regions of the semiconductor substrate to establish an electrical contact having a resistivity;

patterning and etching the conductive layer to form a contact pattern;

treating the semiconductor substrate to lower the resistivity of the electrical contact between the conductive layer and the semiconductor substrate.

10. A method for forming a gate electrode in a semiconductor device according to claim 9 wherein the exposed regions of the semiconductor substrate comprise heavily doped regions of the semiconductor substrate.

11. A method for forming a gate electrode in a semiconductor device according to claim 10 wherein the heavily doped regions are source/drain regions of transistors controlled by the damascene metal gate electrode.

* * * * *